United States Patent
Tso

(10) Patent No.: US 9,865,646 B2
(45) Date of Patent: Jan. 9, 2018

(54) FLEXIBLE LED DISPLAY

(71) Applicant: Cheng-Chang TransFlex Display Corp., Hsinchu County (TW)

(72) Inventor: Hui-Lan Tso, Hsinchu County (TW)

(73) Assignee: Cheng-Chang Transflex Display Corp., Hsinchu County (TW)

( * ) Notice: Subject to any disclaimer, the term of this patent is extended or adjusted under 35 U.S.C. 154(b) by 0 days.

(21) Appl. No.: 15/210,786

(22) Filed: Jul. 14, 2016

(65) Prior Publication Data

US 2017/0092691 A1    Mar. 30, 2017

(30) Foreign Application Priority Data

Sep. 30, 2015 (TW) .............................. 104132015 A
Sep. 30, 2015 (TW) .............................. 104215650 A

(51) Int. Cl.

| H01L 29/20 | (2006.01) |
|---|---|
| H01L 27/15 | (2006.01) |
| H01L 23/522 | (2006.01) |
| H01L 33/62 | (2010.01) |
| H01L 23/14 | (2006.01) |
| H01L 23/532 | (2006.01) |
| H01L 23/528 | (2006.01) |

(52) U.S. Cl.
CPC ............ H01L 27/156 (2013.01); H01L 23/14 (2013.01); H01L 23/528 (2013.01); H01L 23/5221 (2013.01); H01L 23/5226 (2013.01); H01L 23/5328 (2013.01); H01L 23/53228 (2013.01); H01L 23/53242 (2013.01); H01L 23/53276 (2013.01); H01L 33/62 (2013.01); *H01L 2933/0066* (2013.01)

(58) Field of Classification Search
CPC ... H01L 27/156; H01L 23/14; H01L 23/5221; H01L 23/5226; H01L 23/528; H01L 23/53242; H01L 23/53276
See application file for complete search history.

(56) References Cited

U.S. PATENT DOCUMENTS

2009/0303426 A1* 12/2009 Kim ..................... G02B 6/0083
349/150

* cited by examiner

*Primary Examiner* — Elias M Ullah
(74) *Attorney, Agent, or Firm* — Muncy Geissler, Olds & Lowe, P.C.

(57) ABSTRACT

This present invention provides a flexible LED display by utilizing flexible wirings and the locations of the conductive pins on the bottom side of each single color LEDs or full color LEDs to make each of the single color LEDs or full color LEDs mount on each pixel defined by the flexible wires formed on the transparent flexible substrate, and this flexible LED display which characterizes in separating the wirings crossing over with each other by a so-called bridge technology and utilizing a single-layered substrate to save costs of processes and materials.

36 Claims, 9 Drawing Sheets

FLEXIBLE LED DISPLAY

This application claims the benefit of TW Invention Patent Application No._104,132,015 filed on Sep. 30, 2015 and TW Utility Model Patent Application No. 104,215,650 filed on Sep. 30, 2015, the entirety of which are incorporated by reference herein.

BACKGROUND OF THE INVENTION

Field of the Invention

The present invention relates to a matrix display, and in particular relates to a flexible LED display.

Description of the Related Art

Recently, a flexible display made of plastic and having light weight and anti-shock properties have been developed. The portability can be maximized by folding or rolling up the flexible display. Meanwhile, this flexible display can be used in many fields such as electronic billboards, window banners, exhibition bulletin boards, and so on.

A conventional flexible display comprises a display device formed on a flexible substrate, wherein various display device can be chosen, such as OLED, LCD or EPD. The displays mentioned above usually comprise thin film transistors, so lots of thin film processes are necessary to form thin film transistors on a flexible substrate to generate a flexible display device. However, the flexible substrate having a thickness of about tens nm is too thin to proceed various thin film processes. Currently, a new method of manufacturing a flexible display was provided, wherein a flexible substrate was formed on a glass substrate in advance, then a display device was formed on the flexible substrate adhered on the glass substrate, then the flexible substrate and the glass substrate was separated. The thermal expansion coefficients (CTE) of flexible substrate made of plastic materials and the glass substrate are different. The flexible substrate and the glass substrate can be easily separated or bending during high temperature process when the bonding force therebetween is weak and results in serious defects. In addition, the conventional single-layered or double-layered flexible LED display is restricted in the wiring design, so the single color (two conductive pad) LEDs are chosen instead of full color LEDs for full color display. Accordingly, the applications of LED displays are still not popular.

In accordance, a new and convenient method of manufacturing a full color flexible display which can overcome above disadvantages is highly expected. This present invention provides a flexible LED display by utilizing flexible wirings and the locations of the conductive pins on the bottom side of each single color LEDs or full color LEDs to make each of the single color LEDs or full color LEDs mount on each pixel defined by the flexible wires formed on the transparent flexible substrate. Furthermore, this present invention provide a flexible LED display which characterizes in separating the wirings crossing over with each other by a so-called bridge technology and utilizing a single-layered substrate to save costs of processes and materials.

SUMMARY OF THE INVENTION

An aspect of this present invention provides a flexible LED display, comprising: a transparent flexible substrate having a top surface and a bottom surface opposite to each other; 3M columns of first flexible wirings and N rows of second flexible wirings formed on the top surface of the flexible substrate, whereby the first flexible wirings and the second flexible wirings cross over with each other to define M*N pixels, and each pixel is addressed by the (i), (i+1) and (i+2) columns of the first flexible wirings and the (j) row of the second flexible wiring, wherein M, N, i, j are natural numbers, and 1≤i≤3M−2, 1≤j≤N; an insulating layer sandwiched between the intersections of each first flexible wiring and each second flexible wiring or overlaid each second flexible wiring; a plurality of LED packages mounted within each of the pixels; a first fan-shaped circuit connected to the first flexible wirings; a second fan-shaped circuit connected to the second flexible wirings; and a driving circuit respectively interconnecting the first fan-shaped circuit and the second fan-shaped circuit.

Another aspect of the LED display as mentioned above, wherein the transparent flexible substrate is selected from one of the group consisting of Polyethylene terephthalate (PET), Poly(methyl methacrylate (PMMA), Polyimide (PI), Polycarbonate (PC) and glass or combination thereof.

Another aspect of the LED display as mentioned above, wherein the first flexible wires and the second flexible wires are selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof.

Another aspect of the LED display as mentioned above, wherein each of the LED packages is designed to emit red, green, blue emission spectrum and mixture thereof.

Another aspect of the LED display as mentioned above, wherein each of the LED packages comprises a plurality of LED units designed to respectively emit red, green or blue emission spectrum.

Another aspect of the LED display as mentioned above, wherein each of the LED packages comprises three LED units designed to respectively emit red, green or blue emission spectrum.

Another aspect of the LED display as mentioned above, wherein each of the LED packages is mounted within each of the pixels by means of a conductive glue cured at a temperature lower than 250 degree C. and/or an anisotropic conductive film (ACF).

Another aspect of the LED display as mentioned above, wherein the insulating layer is consisted of a single-layered or multiple-layered insulating material.

Another aspect of the LED display as mentioned above, whereby each of the LED packages comprises a first conductive pin, a second conductive pin, a third conductive pin and a fourth conductive pin, and the (j) row of the second flexible wire has a first extension part connected to a first conductive pad, and the (i) column of the first flexible wire has a second extension part connected to a second conductive pad, and the (i+1) column of the first flexible wire has a fourth extension part connected to a fourth conductive pad, and the (i+2) column of the first flexible wire has a third extension part connected to a third conductive pad, wherein the first conductive pin is electrically connected to the (j) row of the second flexible wire by interconnecting the first conductive pad, the second conductive pin is electrically connected to the (i) column of the first flexible wire by interconnecting the second conductive pad, the fourth conductive pin is electrically connected to the (i+1) column of the first flexible wire by interconnecting the fourth conductive pad, and the third conductive pin is electrically connected to the (i+2) column of the first flexible wire by interconnecting the third conductive pad.

Another aspect of the LED display as mentioned above, the driving circuit further comprising a driver IC.

Another aspect of the LED display as mentioned above, wherein the (i) column of the first flexible wire is depicted on the left side of each LED package, the (i+2) of the first flexible wire is depicted on the right side of each LED package, and the (i+1) of the first flexible wire is depicted under each LED package.

Another aspect of the LED display as mentioned above, wherein the (i) column of the first flexible wire is depicted on the left side of each LED package, and the (i+2), the (i+1) of the first flexible wire are depicted on the right side of each LED package.

Another aspect of the LED display as mentioned above, further comprising a dielectric layer sandwiched between the intersection of third extension part of the (i+2) column of the first flexible wire and the (i+1) column of the first flexible wire.

Another aspect of the LED display as mentioned above, the dielectric layer is consisted of a single-layered or multiple-layered insulating material.

Another aspect of this invention provides another LED display, comprising: a transparent flexible substrate having a top surface and a bottom surface opposite to each other; 3P columns of first flexible wirings and Q rows of second flexible wirings formed on the top surface of the flexible substrate, whereby the first flexible wirings and the second flexible wirings cross over with each other to define P*Q pixels, and each pixel comprising: a first sub-pixel, addressed by the (r) column of the first flexible wirings and the (s) row of the second flexible wiring; a second sub-pixel, addressed by the (r+1) column of the first flexible wirings and the (s) row of the second flexible wiring; a third sub-pixel, addressed by the (r+2) column of the first flexible wirings and the (s) row of the second flexible wiring; wherein P, Q, r, s are natural numbers, and $1 \leq r \leq 3P-2$, $1 \leq s \leq Q$; an insulating layer sandwiched between the intersections of each first flexible wiring and each second flexible wiring or overlaid each second flexible wiring; a plurality of first LED packages mounted within each of the first sub-pixels; a plurality of second LED packages mounted within each of the second sub-pixels; a plurality of third LED packages mounted within each of the third sub-pixels; a first fan-shaped circuit connected to the first flexible wirings; a second fan-shaped circuit connected to the second flexible wirings; and a driving circuit respectively interconnecting the first fan-shaped circuit and the second fan-shaped circuit.

Another aspect of the LED display as mentioned above, wherein the transparent flexible substrate is selected from one of the group consisting of Polyethylene terephthalate (PET), Poly(methyl methacrylate (PMMA), Polyimide (PI), Polycarbonate (PC) and glass or combination thereof.

Another aspect of the LED display as mentioned above, wherein the first flexible wires and the second flexible wires are selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof.

Another aspect of the LED display as mentioned above, wherein the first LED packages are red LED packages or red LED flip-chips.

Another aspect of the LED display as mentioned above, wherein the second LED packages are green LED packages or green LED flip-chips.

Another aspect of the LED display as mentioned above, wherein the third LED packages are blue LED packages or blue LED flip-chips.

Another aspect of the LED display as mentioned above, wherein each of the first, second, third LED packages is respectively mounted within each of the first-subpixels, each of the second sub-pixels and each of the third sub-pixels by means of a conductive glue cured at a temperature lower than 250 degree C. and/or an anisotropic conductive film (ACF).

Another aspect of the LED display as mentioned above, wherein the insulating layer is consisted of a single-layered or multiple-layered insulating material.

Another aspect of the LED display as mentioned above, whereby: each of the first LED packages comprises a fifth conductive pin and a sixth conductive pin, and the (s) row of the second flexible wire has a fifth extension part connected to a fifth conductive pad, and the (r) column of the first flexible wire has a sixth extension part connected to a sixth conductive pad, wherein the fifth conductive pin is electrically connected to the (s) row of the second flexible wire by interconnecting the fifth conductive pad, and the sixth conductive pin is electrically connected to the (r) column of the first flexible wire by interconnecting the sixth conductive pad; each of the second LED packages comprises a seventh conductive pin and a eighth conductive pin, and the (s) row of the second flexible wire has a seventh extension part connected to a seventh conductive pad, and the (r+1) column of the first flexible wire has an eighth extension part connected to an eighth conductive pad, wherein the seventh conductive pin is electrically connected to the (s) row of the second flexible wire by interconnecting the seventh conductive pad, and the eighth conductive pin is electrically connected to the (r+1) column of the first flexible wire by interconnecting the eighth conductive pad; and each of the third LED packages comprises a ninth conductive pin and a tenth conductive pin, and the (s) row of the second flexible wire has a ninth extension part connected to a ninth conductive pad, and the (r+2) column of the first flexible wire has a tenth extension part connected to a tenth conductive pad, wherein the ninth conductive pin is electrically connected to the (s) row of the second flexible wire by interconnecting the ninth conductive pad, and the tenth conductive pin is electrically connected to the (r+2) column of the first flexible wire by interconnecting the tenth conductive pad Another aspect of the LED display as mentioned above, the driving circuit further comprising a driver IC.

Another aspect of this invention provides another LED display, comprising: a transparent flexible substrate having a top surface and a bottom surface opposite to each other; 2A columns of first flexible wirings and 2B rows of second flexible wirings formed on the top surface of the flexible substrate, whereby the first flexible wirings and the second flexible wirings cross over with each other to define A*B pixels, and each pixel comprising: a first sub-pixel, addressed by the (d) column of the first flexible wirings and the (e) row of the second flexible wiring; a second sub-pixel, addressed by the (d+1) column of the first flexible wirings and the (e) row of the second flexible wiring; a third sub-pixel, addressed by the (d) column of the first flexible wirings and the (e+1) row of the second flexible wiring; a fourth sub-pixel, addressed by the (d+1) column of the first flexible wirings and the (e+1) row of the second flexible wiring; wherein A, B, d, e are natural numbers, and $1 \leq d \leq 2A-1$, $1 \leq e \leq 2B-1$; an insulating layer sandwiched between the intersections of each first flexible wiring and each second flexible wiring or overlaid each second flexible wiring; a plurality of first LED packages mounted within each of the first sub-pixels; a plurality of second LED packages mounted within each of the second sub-pixels; a plurality of third LED packages mounted within each of the third sub-pixels; a plurality of fourth LED packages mounted within each of the fourth sub-pixels; a first fan-shaped circuit connected to the first flexible wirings; a second fan-shaped circuit connected to the second flexible wirings; and driving circuit respectively interconnecting the first fan-shaped circuit and the second fan-shaped circuit.

Another aspect of the LED display as mentioned above, wherein the transparent flexible substrate is selected from one of the group consisting of Polyethylene terephthalate (PET), Poly(methyl methacrylate (PMMA), Polyimide (PI), Polycarbonate (PC) and glass or combination thereof.

Another aspect of the LED display as mentioned above, wherein the first flexible wires and the second flexible wires are selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof.

Another aspect of the LED display as mentioned above, wherein the first LED packages are red LED packages or red LED flip-chips.

Another aspect of the LED display as mentioned above, wherein the second LED packages are green LED packages or green LED flip-chips.

Another aspect of the LED display as mentioned above, wherein the third LED packages are blue LED packages or blue LED flip-chips.

Another aspect of the LED display as mentioned above, wherein the fourth LED packages are yellow LED packages or yellow LED flip-chips.

Another aspect of the LED display as mentioned above, wherein the fourth LED packages are white LED packages or white LED flip-chips.

Another aspect of the LED display as mentioned above, wherein each of the first, second, third LED and fourth packages is respectively mounted within each of the first-subpixels, each of the second sub-pixels, each of the third sub-pixels and each of the fourth sub-pixels by means of a conductive glue cured at a temperature lower than 250 degree C. and/or an anisotropic conductive film (ACF).

Another aspect of the LED display as mentioned above, wherein the insulating layer is consisted of a single-layered or multiple-layered insulating material.

Another aspect of the LED display as mentioned above, whereby: each of the first LED packages comprises a fifth conductive pin and a sixth conductive pin, and the (e) row of the second flexible wire has a fifth extension part connected to a fifth conductive pad, and the (d) column of the first flexible wire has a sixth extension part connected to a sixth conductive pad, wherein the fifth conductive pin is electrically connected to the (e) row of the second flexible wire by interconnecting the fifth conductive pad, and the sixth conductive pin is electrically connected to the (d) column of the first flexible wire by interconnecting the sixth conductive pad; each of the second LED packages comprises a seventh conductive pin and a eighth conductive pin, and the (e) row of the second flexible wire has a seventh extension part connected to a seventh conductive pad, and the (d+1) column of the first flexible wire has an eighth extension part connected to an eighth conductive pad, wherein the seventh conductive pin is electrically connected to the (e) row of the second flexible wire by interconnecting the seventh conductive pad, and the eighth conductive pin is electrically connected to the (d+1) column of the first flexible wire by interconnecting the eighth conductive pad; each of the third LED packages comprises a ninth conductive pin and a tenth conductive pin, and the (e+1) row of the second flexible wire has a ninth extension part connected to a ninth conductive pad, and the (d) column of the first flexible wire has a tenth extension part connected to a tenth conductive pad, wherein the ninth conductive pin is electrically connected to the (e+1) row of the second flexible wire by interconnecting the ninth conductive pad, and the tenth conductive pin is electrically connected to the (d) column of the first flexible wire by interconnecting the tenth conductive pad; and each of the fourth LED packages comprises a eleventh conductive pin and a twelfth conductive pin, and the (e+1) row of the second flexible wire has a eleventh extension part connected to a eleventh conductive pad, and the (d+1) column of the first flexible wire has a twelfth extension part connected to a twelfth conductive pad, wherein the eleventh conductive pin is electrically connected to the (e+1) row of the second flexible wire by interconnecting the eleventh conductive pad, and the twelfth conductive pin is electrically connected to the (d+1) column of the first flexible wire by interconnecting the twelfth conductive pad.

Another aspect of the LED display as mentioned above, the driving circuit further comprising a driver IC.

BRIEF DESCRIPTION OF THE DRAWINGS

FIG. 1A' illustrates the top-view of the flexible LED display according to the embodiment 2.

DETAILED DESCRIPTION OF THE INVENTION

Embodiment 1

Figure 1A:
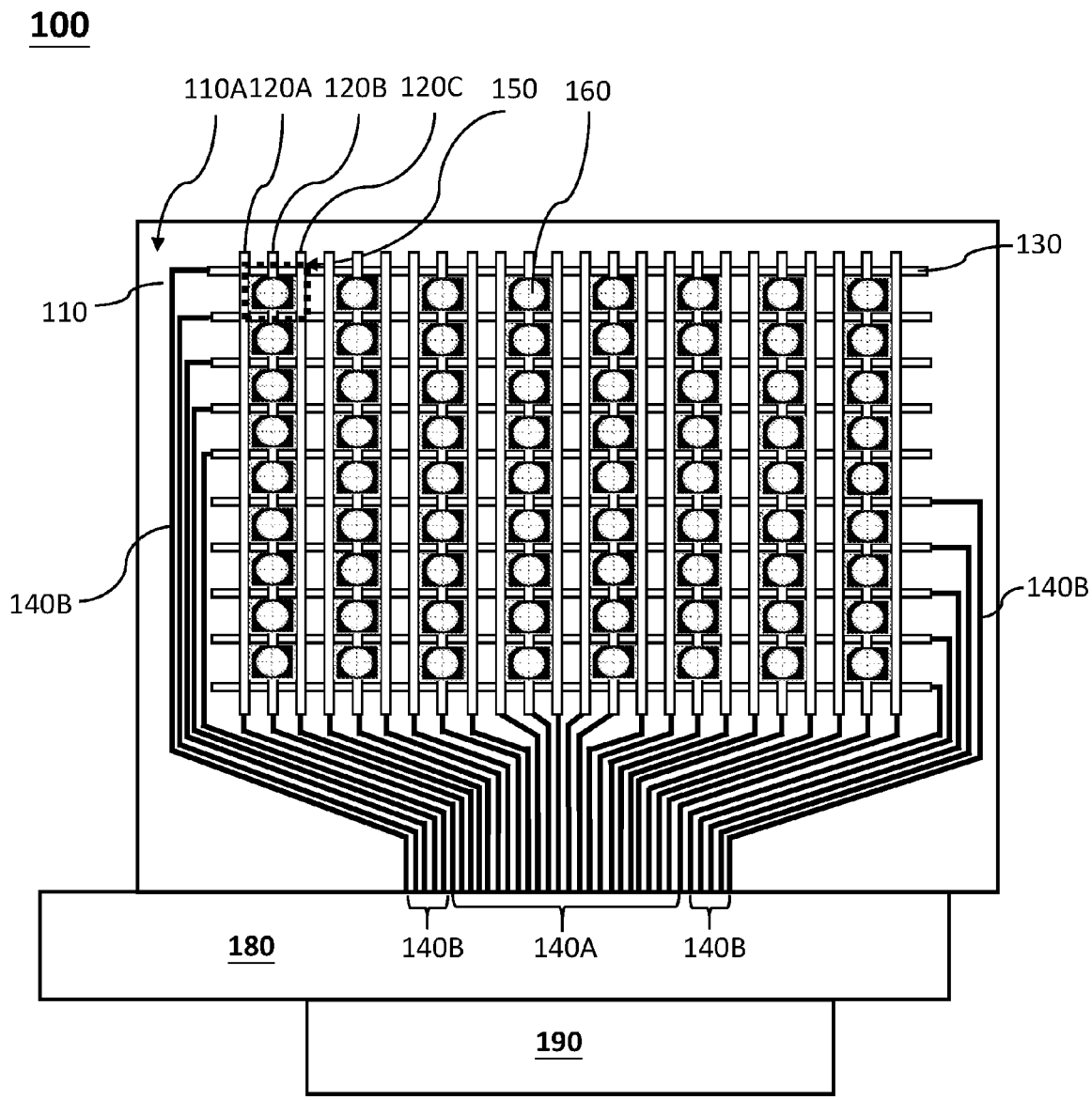
FIG. 1A illustrates the top-view of the flexible LED display according to the embodiment 1.

First, please refer to FIG. 1A which illustrates the top-view of the flexible LED display 100 according to the embodiment 1. As shown in FIG. 1A, the LED display 100 comprises a transparent flexible substrate 110 having a top surface 110A and a bottom surface opposite to each other, which can be selected from one of the group consisting of Polyethylene terephthalate (PET), Poly(methyl methacrylate (PMMA), Polyimide (PI), Polycarbonate (PC) and glass or combination thereof The transparent flexible substrate 110 of this embodiment is consisted of PET.

There are M columns of first flexible wires 120A, M columns of the first flexible wires 120B, and M columns of the first flexible wires 120C alternatively formed in parallel on the top surface 110A of the transparent flexible substrate 110, and N rows of second flexible wires 130 formed on the top surface 110A of the transparent flexible substrate 110 and cross over with the first flexible wires 120A, 120B and 120C to define M*N pixels 150, wherein M and N are both natural numbers.

Besides, the first flexible wires 120A, 120B and 120C are electrically connected to the flexible print circuit board (FPC) 180 via the first fan-shaped circuit 140A to interconnect the driving circuit (not shown) on the driver IC units and control circuit units 190, and the second flexible wires 130 are electrically connected to the flexible print circuit board (FPC) 180 via the second fan-shaped circuit 140B to interconnect the driving circuit (not shown) having driver ICs and control units on the control board 190.

The first flexible wires 120A, 120B and 120C, and the second flexible wires 130 can be selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof. The first flexible wires 120A, 120B and 120C, and the second flexible wires 130 of this embodiment are consisted of carbon nanotube.

Figure 1B:
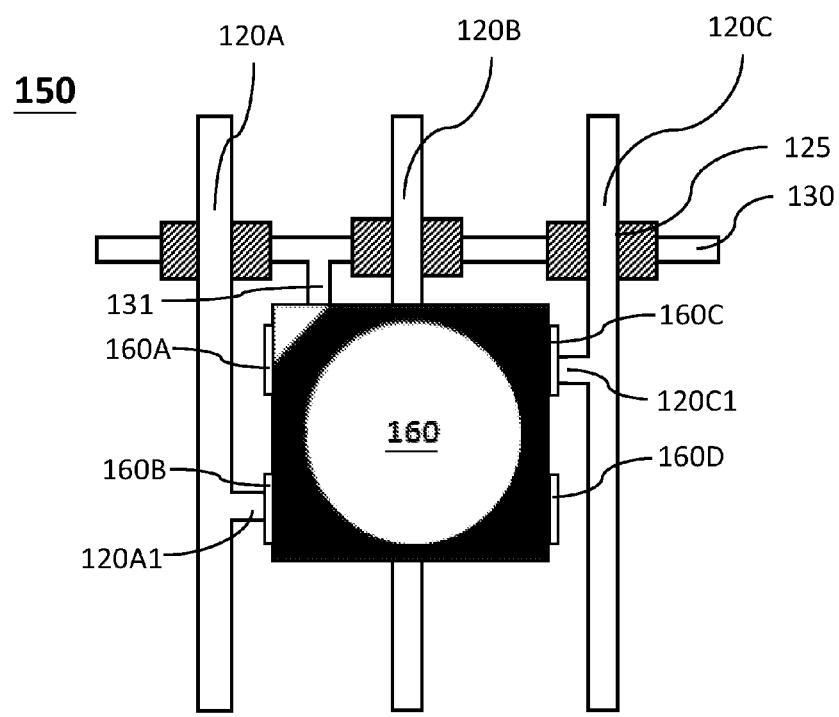
FIGS. 1B~1C illustrate the enlarged views of one of the pixels 150 as shown in FIG. 1A.
Figure 1C:
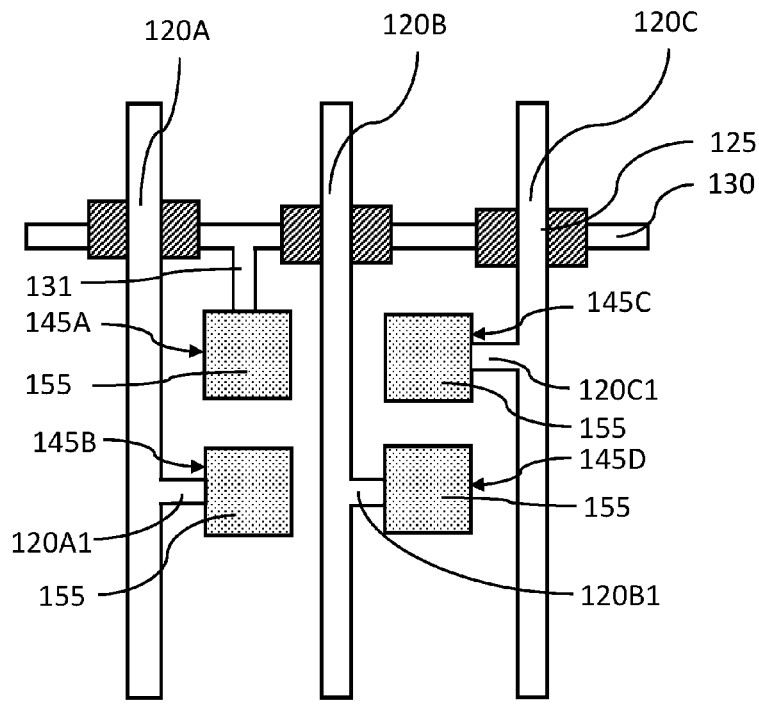
Figure 1A:
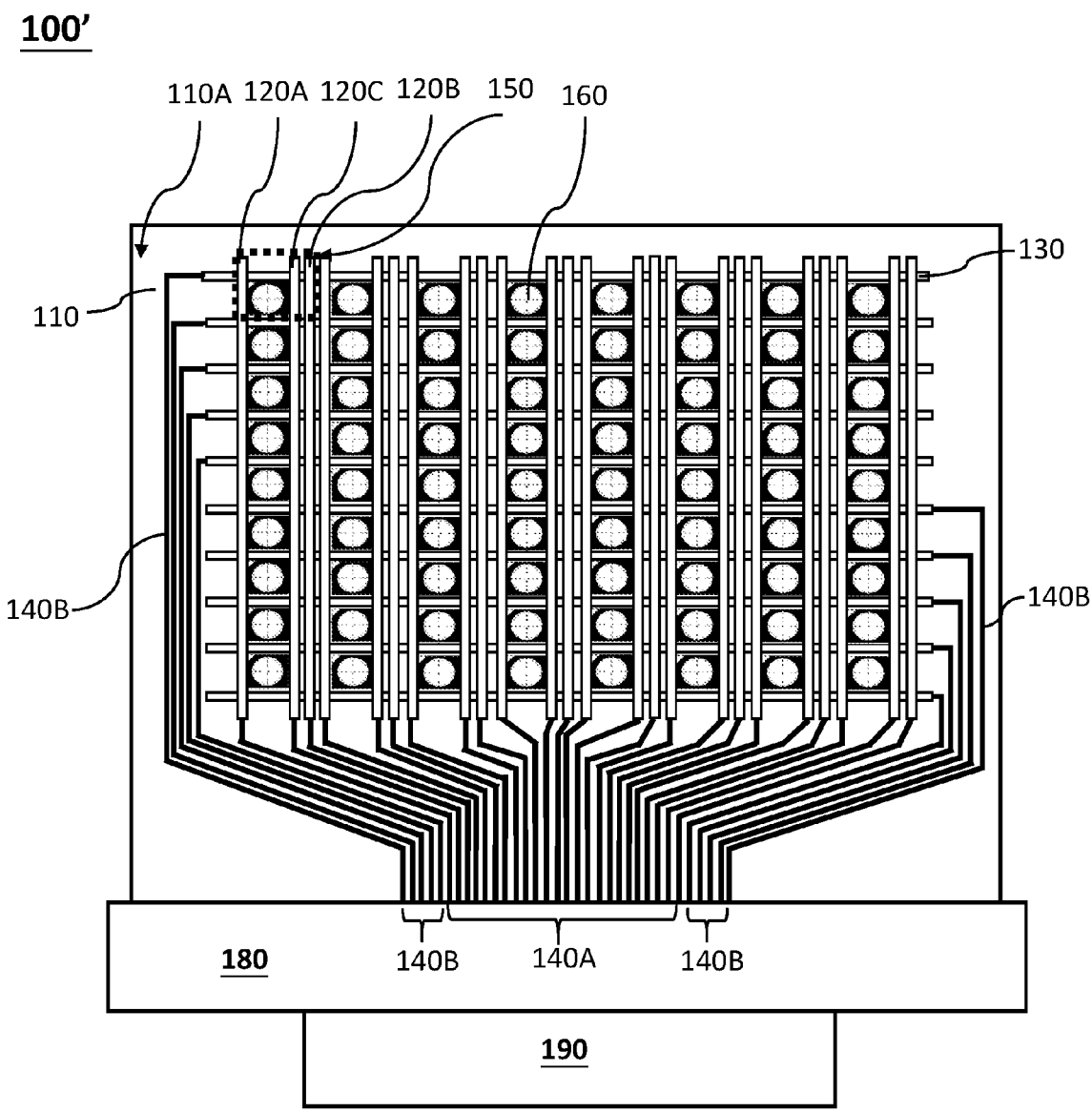
Figure 1B:
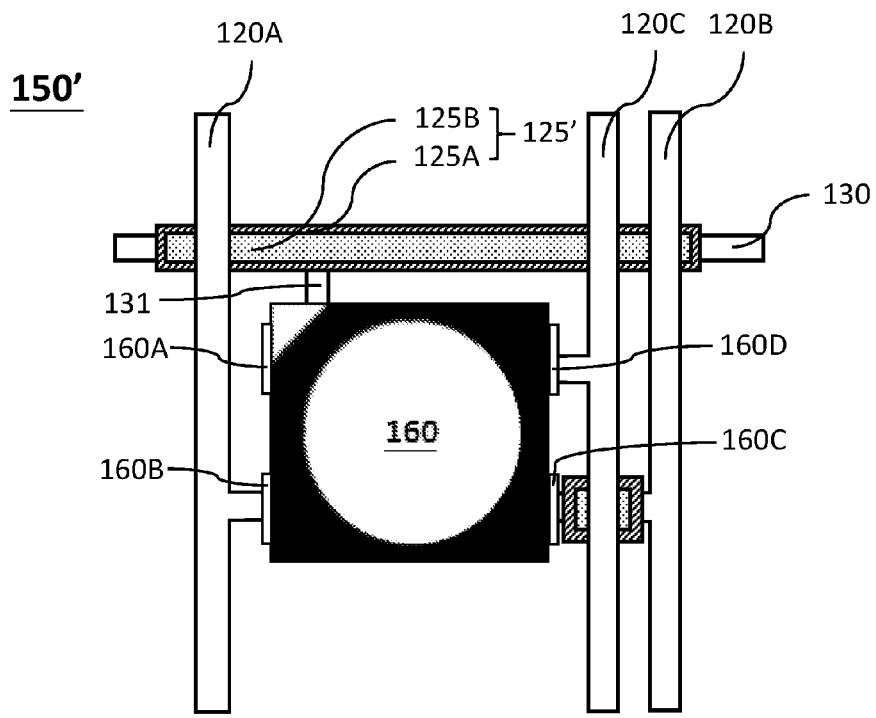
Figure 1C:
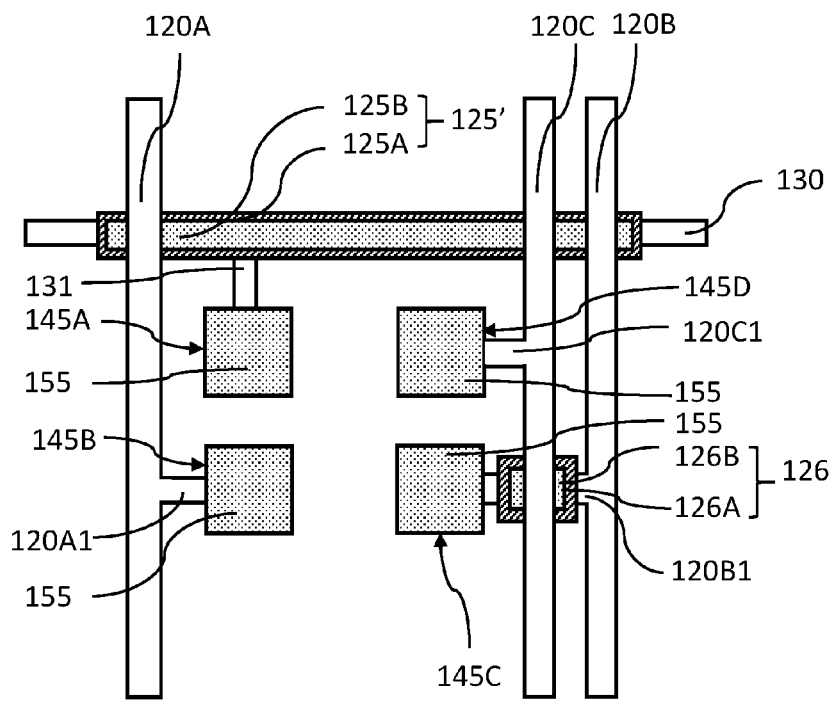

Next, please refer to FIGS. 1B and 1C which illustrate the enlarged views of one of the pixels 150 as shown in FIG. 1A. As illustrated in FIG. 1B, the pixel 150 is addressed by the (i), (i+1) and (i+2) columns of the first flexible wires 120A, 120B and 120C, and the (j) row of the second flexible wiring 130, wherein the (i) column of the first flexible wire 120A is depicted on the left side of each LED package 160, the (i+2) column of the first flexible wire 120C is depicted on the right side of each LED package 160, and the (i+1) column of the first flexible wire 120B is depicted under each LED package 160. A LED package 160 emitting red, green, blue light or mixture thereof is mounted within the pixel 150, wherein i and j are both natural numbers, and $1 \leq i \leq 3M-2$, $1 \leq j \leq N$. Besides, as shown in FIG. 1C, an insulating layer 125 is sandwiched between the intersections of the first flexible wires 120A, 120B, 120C and the second flexible wire 130. Furthermore, the insulating layer 125 can be a single-layered or a double-layered insulating material (not shown) to avoid disconnection owing to the height gap of the first flexible wires 120A, 120B, 120C across each of the second flexible wires 130. Alternatively, the insulating layer 125 can also overall overlay each of the second flexible wires 130 in other embodiments of this invention (not shown).

Each of the LED packages 160 comprises a plurality of LED units (not shown) designed to respectively emit red, green, or blue emission spectrum. The LED units of this embodiment are LED chips respectively emitting red, green or blue emission. In addition, the non-emitting bottom side (not shown) of each LED package 160 comprises a first conductive pin 160A, a second conductive pin 160B, a third conductive pin 160C and a fourth conductive pin 160D. LED units emits suitable visible emission spectrum other than red, green and blue emission spectrums can also be selected as the LED units of the LED package 160. The arrangement of these LED units inside the LED package 160 can be adjusted as needed.

As illustrated in FIGS. 1B~1C, the (j) row of the second flexible wire 130 has a first extension part 131 connected to a first conductive pad 145A, and the (i) column of the first flexible wire 120A has a second extension part 120A1 connected to a second conductive pad 145B, and the (i+1) column of the first flexible wire 120B has a fourth extension part 120B1 connected to a fourth conductive pad 145D, and the (i+2) column of the first flexible wire 120C has a third extension part 120C1 connected to a third conductive pad 145C, whereby the first conductive pin 160A of the LED package 160 is electrically connected to the (j) row of the second flexible wire 130 by interconnecting the first conductive pad 145A by means of the conductive glue 155 cured at a temperature lower than 250 degree C.; the second conductive pin 160B of the LED package 160 is electrically connected to the (i) column of the first flexible wire 120A by interconnecting the second conductive pad 145B by means of the conductive glue 155 cured at a temperature lower than 250 degree C.; the third conductive pin 160C of the LED package 160 is electrically connected to the (i+2) column first flexible wire 120C by interconnecting the third conductive pad 145C by means of the conductive glue 155 cured at a temperature lower than 250 degree C.; and the fourth conductive pin 160D of the LED package 160 is electrically connected to the (i+1) column first flexible wire 120C by interconnecting the fourth conductive pad 145D by means of the conductive glue 155 cured at a temperature lower than 250 degree C. Furthermore, the conductive glue 255 can also be used together with an anisotropic conductive film (ACF) (not shown) or replaced with the anisotropic conductive film (ACF) (not shown) in other embodiments of this invention.

Accordingly, a flexible LED display with a high density array according to this embodiment 1 can be easily manufactured by forming flexible wires on a transparent flexible substrate and mounting each of full color LED packages within each of pixels defined by the flexible wires.

Embodiment 2

First, please refer to FIG. 1A' which illustrates the top-view of the flexible LED display 100' according to the embodiment 2. As shown in FIG. 1A', the LED display 100' comprises a transparent flexible substrate 110 having a top surface 110A and a bottom surface 110B opposite to each other, which can be selected from one of the group consisting of Polyethylene terephthalate (PET), Poly(methyl methacrylate) (PMMA), Polyimide (PI), Polycarbonate (PC) and glass or combination thereof The transparent flexible substrate 110 of this embodiment is consisted of PET.

There are M columns of first flexible wires 120A, M columns of the first flexible wires 120B, and M columns of the first flexible wires 120C alternatively formed in parallel on the top surface 110A of the transparent flexible substrate 110, and N rows of second flexible wires 130 formed on the top surface 110A of the transparent flexible substrate 110 and cross over with the first flexible wires 120A, 120B and 120C to define M*N pixels 150, wherein M and N are both natural numbers.

Besides, the first flexible wires 120A, 120B and 120C are electrically connected to the flexible print circuit board (FPC) 180 via the first fan-shaped circuit 140A to interconnect the driving circuit (not shown) on the driver IC units and control circuit units 190, and the second flexible wires 130 are electrically connected to the flexible print circuit board (FPC) 180 via the second fan-shaped circuit 140B to interconnect the driving circuit (not shown) having driver ICs and control units on the control board 190.

The first flexible wires 120A, 120B and 120C, and the second flexible wires 130 can be selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof. The first flexible wires 120A, 120B and 120C, and the second flexible wires 130 of this embodiment are consisted of carbon nanotube.

Next, please refer to FIGS. 1B' and 1C' which illustrate the enlarged views of one of the pixels 150 as shown in FIG. 1A'. As shown in FIG. 1B', the pixel 150 is addressed by the (i), (i+1) and (i+2) columns of the first flexible wires 120A, 120B and 120C, and the (j) row of the second flexible wiring 130, wherein the (i) column of the first flexible wire 120A is depicted on the left side of each LED package 160, the (i+1) and (i+2) columns of the first flexible wire 120B and 120C are depicted on the right side of each LED package 160. A LED package 160 emitting red, green, blue light or mixture thereof is mounted within each pixel 150, wherein i and j are both natural numbers, and $1 \leq i \leq 3M-2$, $1 \leq j \leq N$. Besides, an insulating layer 125 is formed to overall overlay each of the second flexible wires 130.

The difference between the embodiments 1 and 2 is the first flexible wire 120B of embodiment 2 is depicted on the right side of the LED package 160 instead of depicting under the LED package 160 as that of embodiment 1. In addition, the insulating layer 125' of this embodiment is a double-layered structure including a first insulating layer 125A and a second insulating layer 125B formed on the first insulating layer 125A, and the vertical projection area of the second insulating layer 125B is smaller than that of the first insulating layer 125A. The insulating layer 125' can also be a single-layered structure (not shown) or sandwiched between the intersections of the first flexible wires 120A, 120B, 120C and the second flexible wires 130 in other embodiments of this invention.

Each of the LED packages 160 comprises various LED units (not shown) designed to respectively emit red, green, or blue emission spectrum. The LED units of this embodiment are LED chips respectively emitting red, green or blue emission. In addition, the non-emitting bottom side (not shown) of each LED package 160 comprises a first conductive pin 160A, a second conductive pin 160B, a third conductive pin 160C and a fourth conductive pin 160D. LED units emits suitable visible emission spectrum other than red, green and blue emission spectrums can also be selected as the LED units of the LED package 160. The arrangement of these LED units inside the LED package 160 can be adjusted as needed.

As illustrated in FIGS. 1B'~1C', the (j) row of the second flexible wire 130 has a first extension part 131 connected to a first conductive pad 145A, and the (i) column of the first flexible wire 120A has a second extension part 120A1 connected to a second conductive pad 145B, and the (i+1) column of the first flexible wire 120B has a fourth extension part 120B1 connected to a fourth conductive pad 145D, and the (i+2) column of the first flexible wire 120C has a third extension part 120C1 connected to a third conductive pad 145C, whereby the first conductive pin 160A of the LED package 160 is electrically connected to the (j) row of the second flexible wire 130 by interconnecting the first conductive pad 145A by means of the conductive glue 155 cured at a temperature lower than 250 degree C.; the second conductive pin 160B of the LED package 160 is electrically connected to the (i) column of the first flexible wire 120A by interconnecting the second conductive pad 145B by means of the conductive glue 155 cured at a temperature lower than 250 degree C.; the third conductive pin 160C of the LED package 160 is electrically connected to the (i+2) column first flexible wire 120C by interconnecting the third conductive pad 145C by means of the conductive glue 155 cured at a temperature lower than 250 degree C.; and the fourth conductive pin 160D of the LED package 160 is electrically connected to the (i+1) column first flexible wire 120B by interconnecting the fourth conductive pad 145D by means of the conductive glue 155 cured at a temperature lower than 250 degree C. Furthermore, the conductive glue 155 can also be used together with the anisotropic conductive film (ACF) or replaced with the anisotropic conductive film (ACF) in other embodiments of this invention. A dielectric layer 126 is sandwiched between the intersection of the third extension part 120C1 of the first flexible wire 120C and the first flexible wire 120B, wherein the dielectric layer 126 of this embodiment is a double-layered structure including a first dielectric layer 126A and a second dielectric layer 126B, and the vertical projection area of the second dielectric layer 126B is smaller than that of the first dielectric layer 126A. The dielectric layer 126 of other embodiments of this invention can also be a single-layered structure. Furthermore, the conductive glue 255 can also be used together with an anisotropic conductive film (ACF) (not shown) or replaced with the anisotropic conductive film (ACF) (not shown) in other embodiments of this invention.

Accordingly, a flexible LED display with a high density array of this embodiment 2 can be easily manufactured by forming flexible wires on a transparent flexible substrate and mounting each of full color LED packages in each of pixels defined by the flexible wires.

Embodiment 3

Figure 2A:
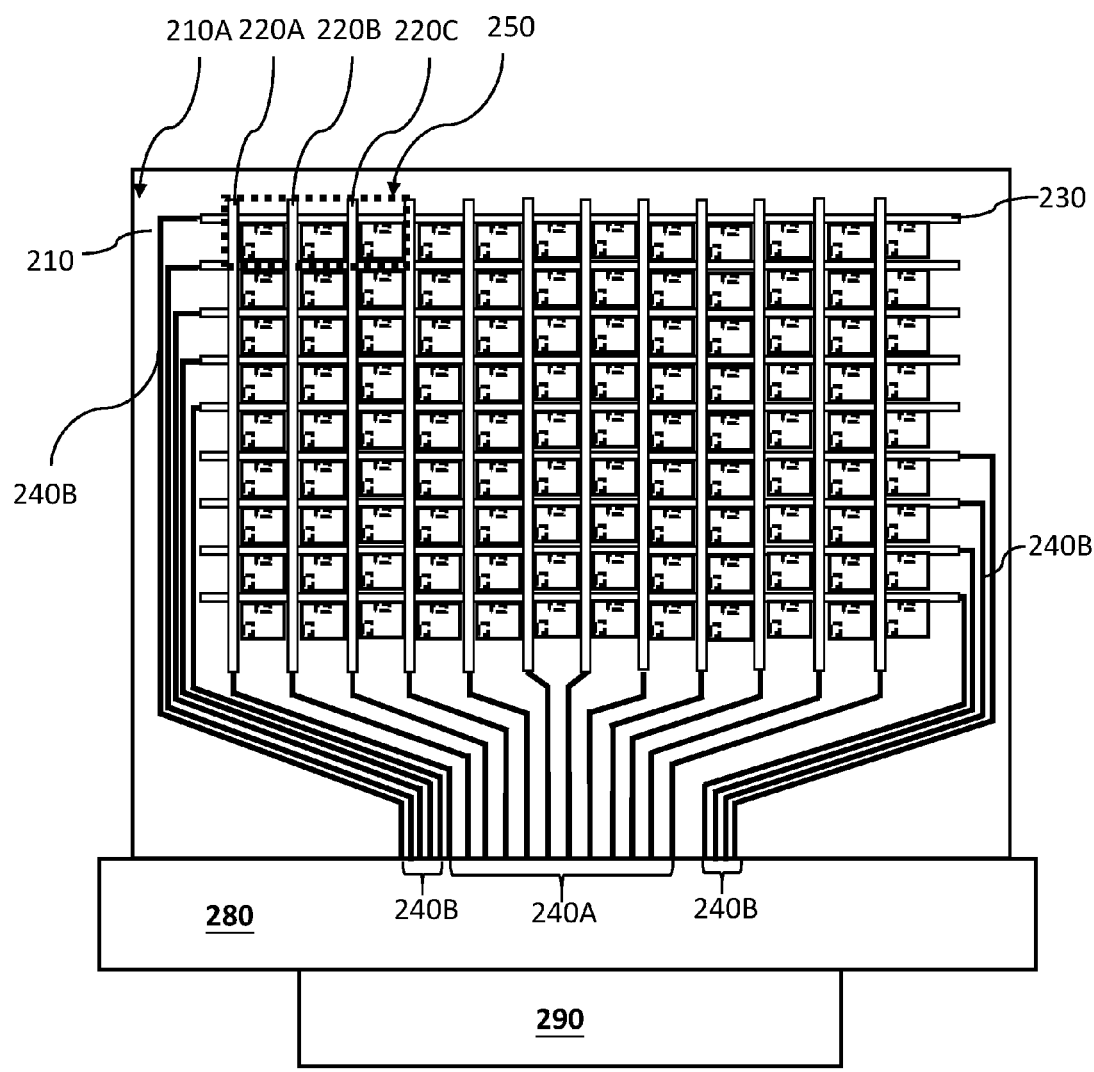
FIG. 2A illustrates the top-view of the flexible LED display according to the embodiment 3.

First, please refer to FIG. 2A which illustrates the top-view of the flexible LED display according to the embodiment 3. As shown in FIG. 2A, the LED display 200 comprises a transparent flexible substrate 210 having a top surface 210A and a bottom surface 210B opposite to each other, which can be selected from one of the group consisting of Polyethylene terephthalate (PET), Poly(methyl methacrylate) (PMMA), Polyimide (PI), Polycarbonate (PC) and glass or combination thereof The transparent flexible substrate 210 of this embodiment is consisted of PET.

There are P columns of first flexible wires 220A, P columns of the first flexible wires 220B, and P columns of the first flexible wires 220C alternatively formed in parallel on the top surface 210A of the transparent flexible substrate 210, and Q rows of second flexible wires 230 formed on the top surface 210A of the transparent flexible substrate 210 and cross over with the first flexible wires 220A, 220B and 220C to define P*Q pixels 250, wherein P and Q are both natural numbers.

Besides, the first flexible wires 220A, 220B and 220C are electrically connected to the flexible print circuit board (FPC) 280 via the first fan-shaped circuit 240A to interconnect the driving circuit (not shown) on the driver IC units and control circuit units 290, and the second flexible wires 230 are electrically connected to the flexible print circuit board (FPC) 280 via the second fan-shaped circuit 240B to interconnect the driving circuit (not shown) having driver ICs and control units on the control board 290.

The first flexible wires 220A, 220B and 220C, and the second flexible wires 230 can be selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof. The first flexible wires 220A, 220B and 220C, and the second flexible wires 230 of this embodiment are consisted of carbon nanotube.

Figure 2B:
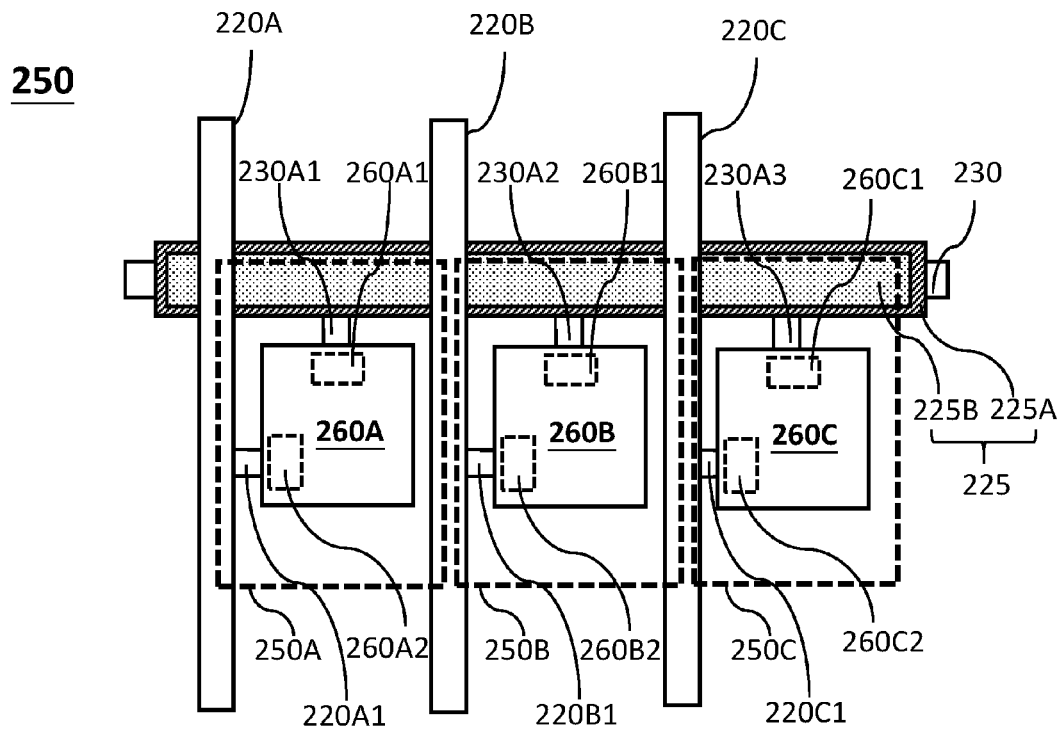
FIGS. 2B~2C illustrate the enlarged views of one of the pixels 250 as shown in FIG. 2A.
Figure 2C:
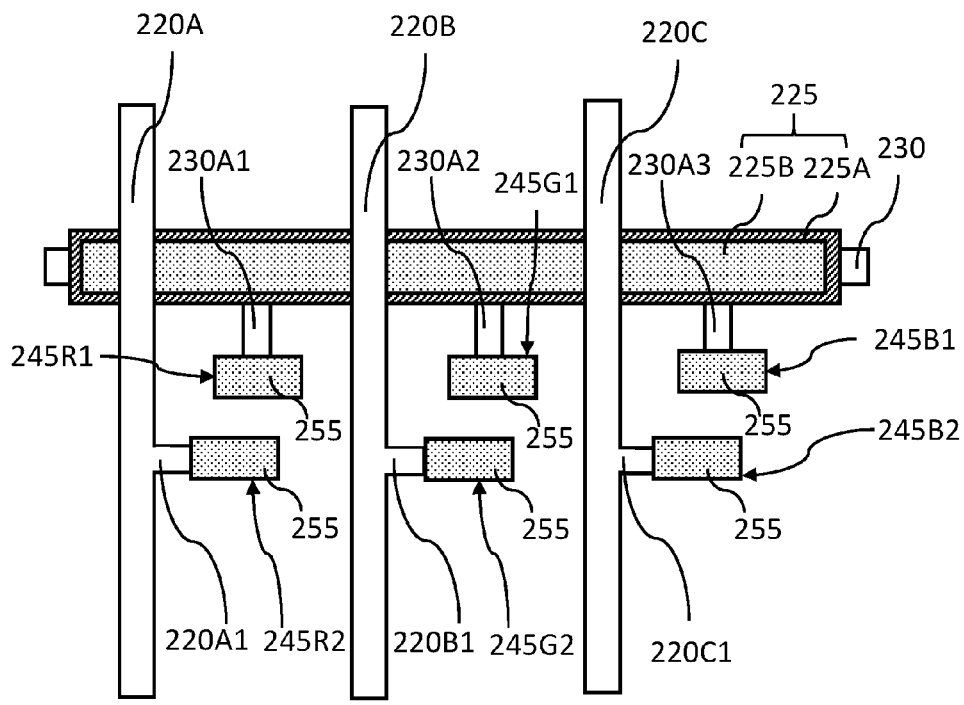

Next, please refer to FIGS. 2B and 2C which illustrate the enlarged views of one of the pixels 250 as shown in FIG. 2A. As illustrated in FIG. 2B, each pixel 250 includes a first sub-pixel 250A addressed by the (r) column of the first flexible wires 220A and the (s) row of the second flexible wiring 230; a second sub-pixel 250B addressed by the (r+1) column of the first flexible wires 220B and the (s) row of the second flexible wiring 230; and a third sub-pixel 250C addressed by the (r+2) column of the first flexible wires 220C and the (s) row of the second flexible wiring 230, whereby r, s are both natural numbers, and $1 \leq r \leq 3P-2$, $1 \leq s \leq Q$.

As illustrated in FIGS. 2B and 2C, each of the second flexible wires 230 is overlaid by an insulating layer 225 to insulate the first flexible wires 220A, 220B and 220C. The insulating layer 225 is a double-layered structure including a first insulating layer 225A and a second insulating layer 225B formed on the first insulating layer 225B, and the vertical projection area of the second insulating layer 225B is smaller than that of the first insulating layer 225A. The insulating layer 225 of other embodiments of this invention can also be a single-layered structure (not shown) or sandwiched between the intersections (not shown) of the first flexible wires 220A, 220B, 220C and the second flexible wires 230.

Next, a plurality of first LEDs 260A are provided and mounted within each first sub-pixel 250A, whereby each of the first LEDs 260A has a fifth conductive pin 260A1 and a sixth conductive pin 260A2 on its non-emitting side (not shown). A plurality of second LEDs 260B are provided and mounted within each second sub-pixel 250B, whereby each of the second LEDs 260B has a seventh conductive pin 260B1 and a eighth conductive pin 260B2 on its non-emitting side (not shown). A plurality of third LEDs 260C are provided and mounted within each third sub-pixel 250C, whereby each of the third LEDs 260C has a ninth conductive pin 260C1 and a tenth conductive pin 260C2 on its non-emitting side (not shown).

The first LEDs 260A of this embodiment are red LED packages; the second LEDs 260B of this embodiment are green LED packages; and the third LEDs 260C of this embodiment are blue LED packages. The first LEDs 260A, the second LEDs 260B and the third LEDs 260C of other embodiments of this invention can be selected from LED packages emitting visible spectrum other than red, green and blue emission spectrum, and the arrangement of these LED packages can be adjusted as needed. Furthermore, the first LEDs 260A, the second LEDs 260B and the third LEDs 260C can also be replaced with red LED flip chips, green LED flip chips and blue LED flip chips, and the arrangement of these LED flip chips can also be adjusted as needed.

As illustrated in FIGS. 2B and 2C, the (s) row of the second flexible wire 230 has a fifth extension part 230A1 connected to a fifth conductive pad 245R1, and the (r) column of the first flexible wire 220A has a sixth extension part 220A1 connected to a sixth conductive pad 245R2, whereby the fifth conductive pin 260A1 of the first LED 260A is electrically connected to the (s) row of the second flexible wire 230A by interconnecting the fifth conductive pad 245R1 by means of a conductive glue 255 cured at a temperature lower than 250 degree C., and the sixth conductive pin 260A2 is electrically connected to the (r) column of the first flexible wire 220A by interconnecting the sixth conductive pad 245R2 by means of a conductive glue 255 cured at a temperature lower than 250 degree C.; the (s) row of the second flexible wire 230 has a seventh extension part 230A2 connected to a seventh conductive pad 245G1, and the (r+1) column of the first flexible wire 220B has an eighth extension part 220B1 connected to an eighth conductive pad 245G2, wherein the seventh conductive pin 260B1 is electrically connected to the (s) row of the second flexible wire 230 by interconnecting the seventh conductive pad 245G1, and the eighth conductive pin 260B2 is electrically connected to the (r+1) column of the first flexible wire 220B by interconnecting the eighth conductive pad 245G2 by means of a conductive glue 255 cured at a temperature lower than 250 degree C.; and the (s) row of the second flexible wire 230 has a ninth extension part 230A3 connected to a ninth conductive pad 245B1, and the (r+2) column of the first flexible wire 220C has a tenth extension part 220C1 connected to a tenth conductive pad 245B2, wherein the ninth conductive pin 260C1 is electrically connected to the (s) row of the second flexible wire 230 by interconnecting the ninth conductive pad 245B1 by means of a conductive glue 255 cured at a temperature lower than 250 degree C., and the tenth conductive pin 260C2 is electrically connected to the (r+2) column of the first flexible wire 220C by interconnecting the tenth conductive pad 245B2 by means of a conductive glue 255 cured at a temperature lower than 250 degree C. Furthermore, the conductive glue 255 can also be used together with an anisotropic conductive film (ACF) (not shown) or replaced with the anisotropic conductive film (ACF) (not shown) in other embodiments of this invention.

Accordingly, a flexible LED display with a high density array of this embodiment 3 can be easily manufactured by forming flexible wires on a transparent flexible substrate and mounting each of red, green and blue LED packages or flip chips in each of pixels defined by the flexible wires.

Embodiment 4

Figure 3A:
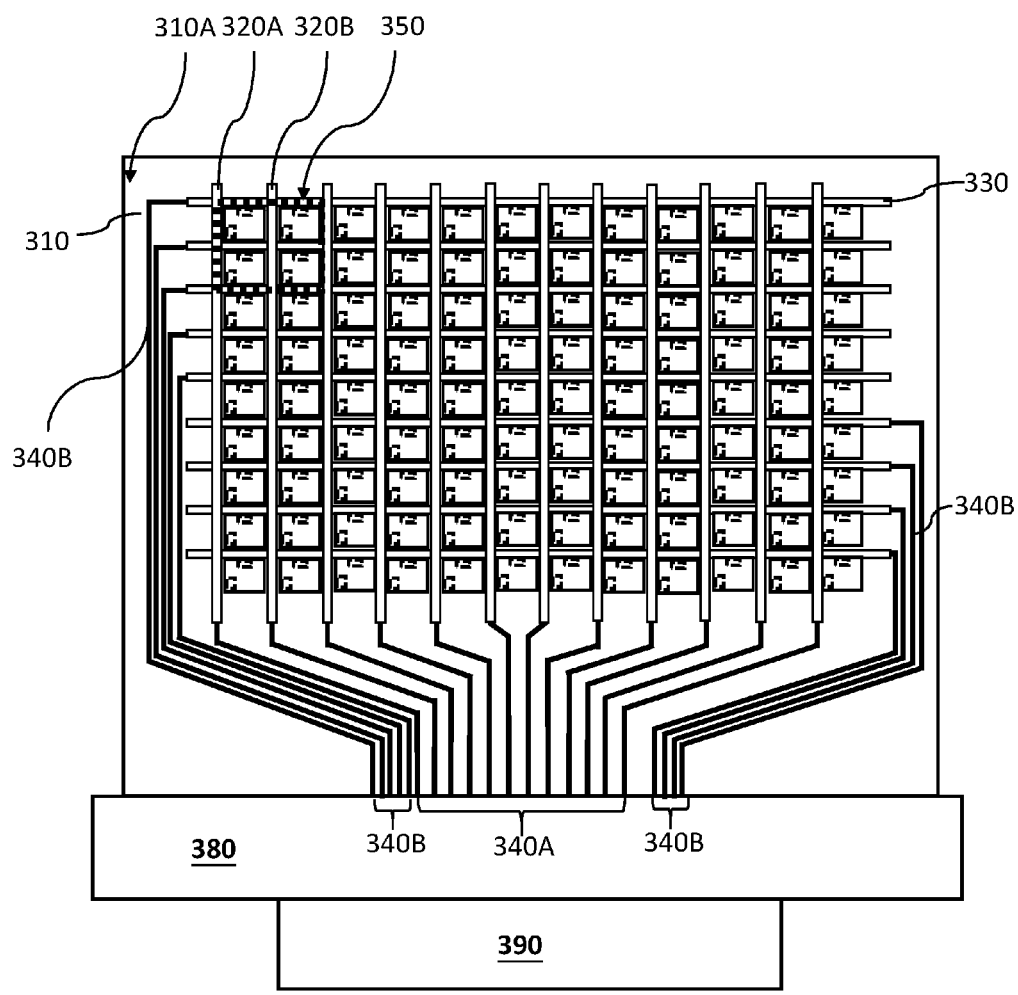
FIG. 3A illustrates the top-view of the flexible LED display according to the embodiment 4.

First, please refer to FIG. 3A which illustrates the top-view of the flexible LED display 300 according to the embodiment 4. As illustrated in FIG. 3A, the LED display 300 comprises a transparent flexible substrate 310 having a top surface 310A and a bottom surface 310B opposite to each other, which can be selected from one of the group consisting of Polyethylene terephthalate (PET), Poly(methyl methacrylate (PMMA), Polyimide (PI), Polycarbonate (PC) and glass or combination thereof The transparent flexible substrate 310 of this embodiment is consisted of PET.

There are A columns of first flexible wires 320A and A columns of the second flexible wires 320B alternatively formed in parallel on the top surface 310A of the transparent flexible substrate 310, and B rows of second flexible wires 330A and B rows of second flexible wires 330B alternatively formed in parallel on the top surface 310A of the transparent flexible substrate 310 and cross over with the first flexible wires 320A and 320B to define A*B pixels 350, wherein A and B are both natural numbers.

Besides, the first flexible wires 320A and 320B are electrically connected to the flexible print circuit board (FPC) 380 via the first fan-shaped circuit 340A to interconnect the driving circuit (not shown) on the driver IC units and control circuit units 390, and the second flexible wires 330A and 330B are electrically connected to the flexible print circuit board (FPC) 380 via the second fan-shaped circuit 340B to interconnect the driving circuit (not shown) having driver ICs and control units on the control board 390.

The first flexible wires 320A and 320B, and the second flexible wires 330A and 330B can be selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof. The first flexible wires 320A and 320B, and the second flexible wires 330A and 330B of this embodiment are consisted of carbon nanotube.

Figure 3B:
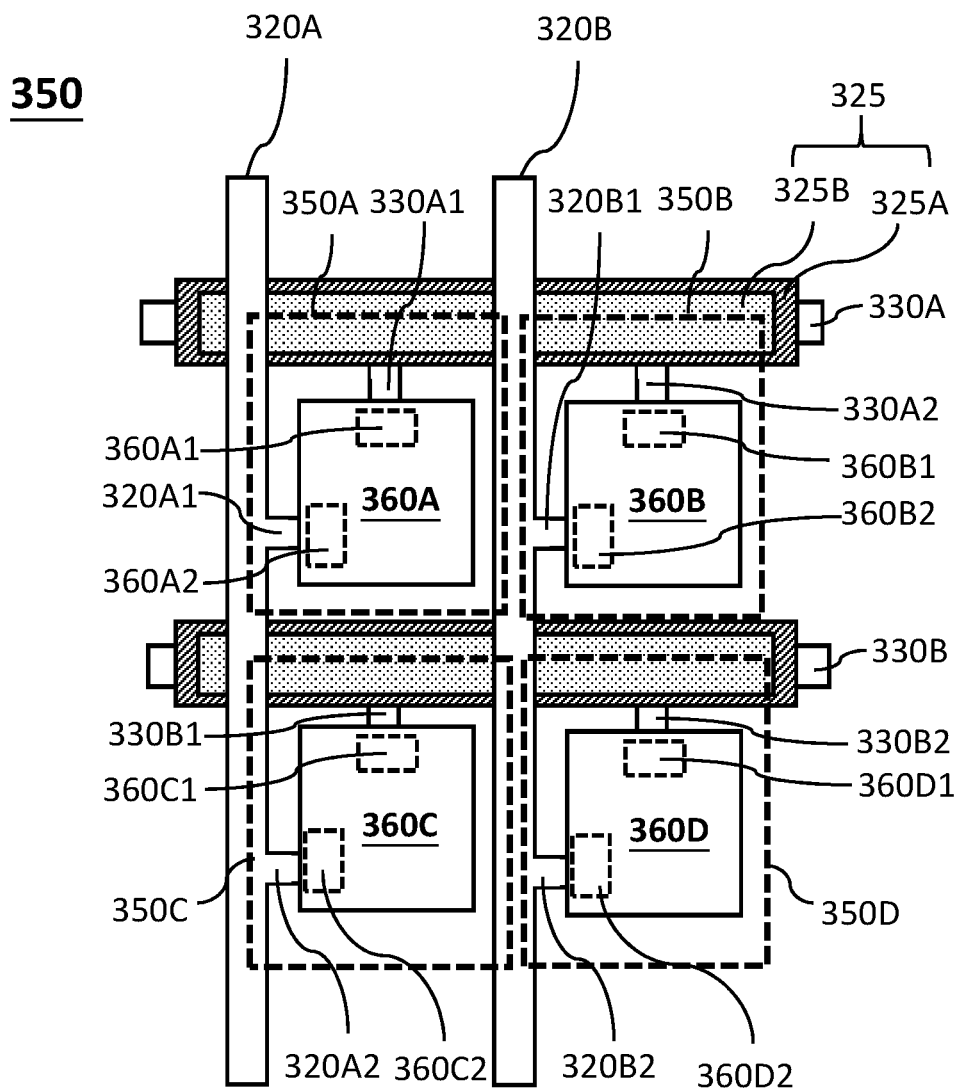
FIGS. 3B~3C illustrate the enlarged views of one of the pixels 350 as shown in FIG. 3A.
Figure 3C:
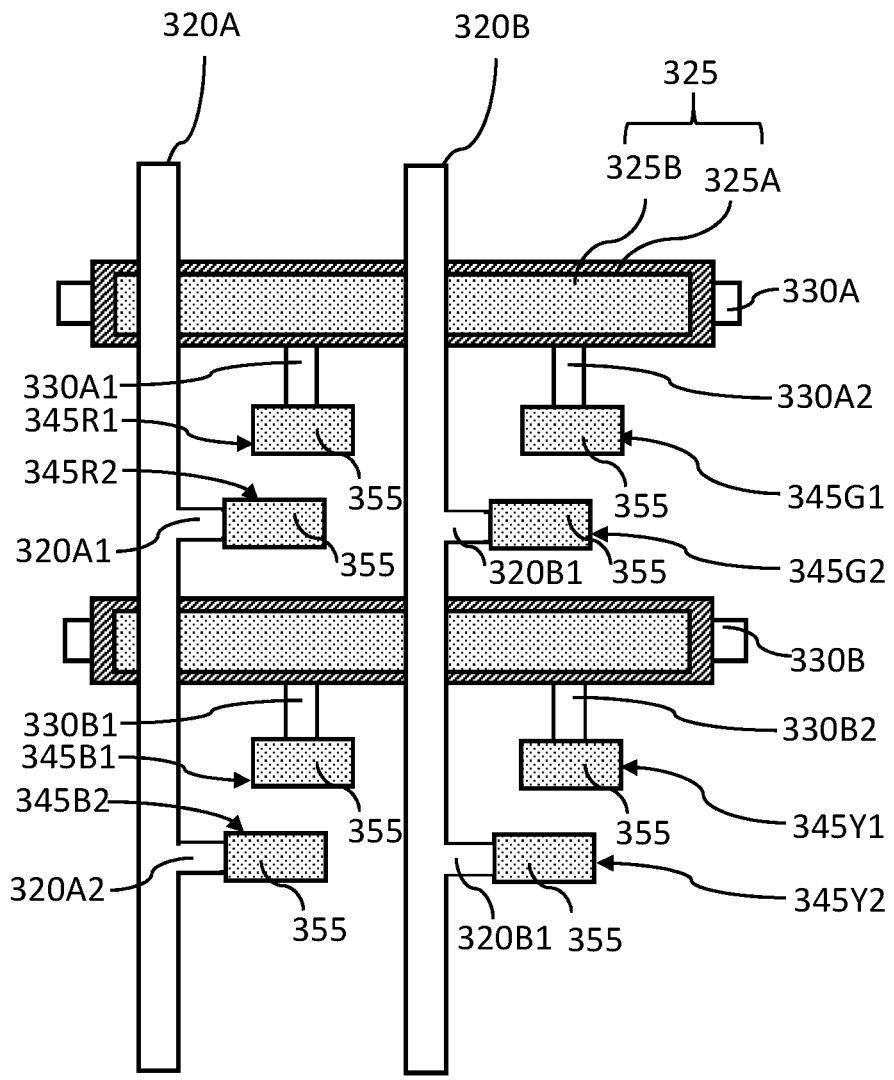

Next, please refer to FIGS. 3B and 3C which illustrate the enlarged views of one of the pixels 350 as shown in FIG. 3A. As illustrated in FIG. 3B, each pixel 350 includes a first sub-pixel 350A addressed by the (d) column of the first flexible wires 320A and the (e) row of the second flexible wiring 330A; a second sub-pixel 350B addressed by the (d+1) column of the first flexible wires 320B and the (e) row of the second flexible wiring 330A; and a third sub-pixel 350C addressed by the (d) column of the first flexible wires 320A and the (e+1) row of the second flexible wiring 330B; and a fourth sub-pixel 350D addressed by the (d+1) column of the first flexible wires 320B and the (e+1) row of the second flexible wiring 330B, whereby d and e are both natural numbers, and 1≤d≤2A−1, 1≤e≤2B−1.

Each of the second flexible wires 330A and 330B is overlaid by an insulating layer 325 to insulate the first flexible wires 320A and 320B. The insulating layer 325 is a double-layered structure including a first insulating layer 325A and a second insulating layer 325B formed on the first insulating layer 325B, and the vertical projection area of the second insulating layer 325B is smaller than that of the first insulating layer 325A. The insulating layer 325 of other embodiments of this invention can also be a single-layered structure (not shown) or sandwiched between the intersections (not shown) of the first flexible wires 320A and 320B and the second flexible wires 330A and 330B.

Next, A plurality of first LEDs 360A are provided and mounted within each first sub-pixel 350A, whereby each of the first LEDs 360A having a fifth conductive pin 360A1 and a sixth conductive pin 360A2 on its non-emitting side (not shown). A plurality of second LEDs 360B are provided and mounted within each second sub-pixel 350B, whereby each of the second LEDs 360B having a seventh conductive pin 360B1 and a eighth conductive pin 360B2 on its non-emitting side (not shown). A plurality of third LEDs 360C are provided and mounted within each third sub-pixel 350C, whereby each of the third LEDs 360C having a ninth conductive pin 360C1 and a tenth conductive pin 360C2 on its non-emitting side (not shown). A plurality of fourth LEDs 360D are provided and mounted within each fourth sub-pixel 350D, whereby each of the fourth LEDs 360D having a eleventh conductive pin 360D1 and a twelfth conductive pin 360D2 on its non-emitting side (not shown).

The first LEDs 360A of this embodiment are red LED packages; the second LEDs 360B of this embodiment are green LED packages; the third LEDs 360C of this embodiment are blue LED packages; and the fourth LEDs 360D of this embodiment are yellow or white LED packages. The first LEDs 360A, the second LEDs 360B, the third LEDs 360C and the fourth LEDs 360D of other embodiments of this invention can be selected from LED packages emitting visible spectrum other than red, green, blue, yellow and white emission spectrum, and the arrangement of these LED packages can be adjusted as needed. Furthermore, the first LEDs 360A, the second LEDs 360B, the third LEDs 360C and the fourth LEDs 360D can also be replaced with red LED flip chips, green LED flip chips, blue LED flip chips and yellow or white LED flip chips, and the arrangement of these LED flip chips can also be adjusted as needed.

As illustrated in FIGS. 3B and 3C, the (e) row of the second flexible wire 330A has a fifth extension part 330A1 connected to a fifth conductive pad 345R1, and the (d) column of the first flexible wire 320A has a sixth extension part 320A1 connected to a sixth conductive pad 345R2, whereby the fifth conductive pin 360A1 of the first LED 360A is electrically connected to the (e) row of the second flexible wire 330A by interconnecting the fifth conductive pad 345R1 by means of a conductive glue 355 cured at a temperature lower than 250 degree C., and the sixth conductive pin 360A2 is electrically connected to the (d) column of the first flexible wire 320A by interconnecting the sixth conductive pad 345R2 by means of a conductive glue 355 cured at a temperature lower than 250 degree C.; the (e) row of the second flexible wire 230 has a seventh extension part 330A2 connected to a seventh conductive pad 345G1, and the (d+1) column of the first flexible wire 320B has an eighth extension part 320B1 connected to an eighth conductive pad 345G2, wherein the seventh conductive pin 360B1 of the second LED 360B is electrically connected to the (e) row of the second flexible wire 330A by interconnecting the seventh conductive pad 345G1 by means of a conductive glue 355 cured at a temperature lower than 250 degree C., and the eighth conductive pin 360B2 is electrically connected to the (d+1) column of the first flexible wire 320B by interconnecting the eighth conductive pad 345G2 by means of a conductive glue 2355 cured at a temperature lower than 250 degree C.; the (d) row of the second flexible wire 320A has a ninth extension part 320A2 connected to a ninth conductive pad 345B1, and the (e+1) column of the first flexible wire 330B has a tenth extension part 330B1 connected to a tenth conductive pad 345B2, wherein the ninth conductive pin 360C1 of the third LED 360C is electrically connected to the (e+1) row of the second flexible wire 330B by interconnecting the ninth conductive pad 345B1 by means of a conductive glue 355 cured at a temperature lower than 250 degree C., and the tenth conductive pin 360C2 is electrically connected to the (d) column of the first flexible wire 320A by interconnecting the tenth conductive pad 345B2 by means of a conductive glue 355 cured at a temperature lower than 250 degree C.; and the (e+1) row of the second flexible wire 330B has a eleventh extension part 330B2 connected to a eleventh conductive pad 345Y1, and the (d+1) column of the first flexible wire 320B has a twelfth extension part 320B1 connected to a twelfth conductive pad 345Y2, wherein the eleventh conductive pin 360D1 of the fourth LED 360D is electrically connected to the (e+1) row of the second flexible wire 330B by interconnecting the eleventh conductive pad 345Y1 by means of a conductive glue 355 cured at a temperature lower than 250 degree C., and the twelfth conductive pin 360D2 is electrically connected to the (d+1) column of the first flexible wire 320B by interconnecting the twelfth conductive pad 345Y2 by means of a conductive glue 355 cured at a temperature lower than 250 degree C. Furthermore, the conductive glue 255 can also be used together with an anisotropic conductive film (ACF) (not shown) or replaced with the anisotropic conductive film (ACF) (not shown) in other embodiments of this invention.

Accordingly, a flexible LED display with a high density array of this embodiment 4 can be easily manufactured by forming flexible wires on a transparent flexible substrate and mounting each of red, green, blue and yellow or white LED packages or flip chips in each of pixels defined by the flexible wires.

To sum up, this present invention provides a flexible LED display by utilizing flexible wirings and the locations of the conductive pins on the bottom side of each single color LEDs or full color LEDs to make each of the single color LEDs or full color LEDs mount on each pixel defined by the flexible wires formed on the transparent flexible substrate.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangement.

What is claimed is:
1. A flexible LED display, comprising:
 a transparent flexible substrate having a top surface and a bottom surface opposite to each other;

3M columns of first flexible wirings and N rows of second flexible wirings formed on the top surface of the flexible substrate, whereby the first flexible wirings and the second flexible wirings cross over with each other to define M*N pixels, and each pixel is addressed by the (i), (i+1) and (i+2) columns of the first flexible wirings and the (j) row of the second flexible wiring, wherein M, N, i, j are natural numbers, and $1 \leq i \leq 3M-2$, $1 \leq j \leq N$;

an insulating layer sandwiched between the intersections of each first flexible wiring and each second flexible wiring or overlaid each second flexible wiring;

a plurality of LED packages mounted within each of the pixels;

a first fan-shaped circuit connected to the first flexible wirings;

a second fan-shaped circuit connected to the second flexible wirings; and a driving circuit respectively interconnecting the first fan-shaped circuit and the second fan-shaped circuit.

2. The flexible LED display of claim 1, wherein the transparent flexible substrate is selected from one of the group consisting of Polyethylene terephthalate (PET), Poly (methyl methacrylate (PMMA), Polyimide (PI), Polycarbonate (PC) and glass or combination thereof.

3. The flexible LED display of claim 1, wherein the first flexible wires and the second flexible wires are selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof.

4. The flexible LED display of claim 1, wherein each of the LED packages is designed to emit red, green, blue emission spectrum and mixture thereof.

5. The flexible LED display of claim 4, wherein each of the LED packages comprises a plurality of LED units designed to respectively emit red, green or blue emission spectrum.

6. The flexible LED display of claim 5, wherein each of the LED packages comprises three LED units designed to respectively emit red, green or blue emission spectrum.

7. The flexible LED display of claim 1, wherein each of the LED packages is mounted within each of the pixels by means of a conductive glue cured at a temperature lower than 250 degree C. and/or an anisotropic conductive film (ACF).

8. The flexible LED display of claim 1, wherein the insulating layer is consisted of a single-layered or multiple-layered insulating material.

9. The flexible LED display of claim 1, whereby each of the LED packages comprises a first conductive pin, a second conductive pin, a third conductive pin and a fourth conductive pin, and the (j) row of the second flexible wire has a first extension part connected to a first conductive pad, and the (i) column of the first flexible wire has a second extension part connected to a second conductive pad, and the (i+1) column of the first flexible wire has a fourth extension part connected to a fourth conductive pad, and the (i+2) column of the first flexible wire has a third extension part connected to a third conductive pad, wherein the first conductive pin is electrically connected to the (j) row of the second flexible wire by interconnecting the first conductive pad, the second conductive pin is electrically connected to the (i) column of the first flexible wire by interconnecting the second conductive pad, the fourth conductive pin is electrically connected to the (i+1) column of the first flexible wire by interconnecting the fourth conductive pad, and the third conductive pin is electrically connected to the (i+2) column of the first flexible wire by interconnecting the third conductive pad.

10. The flexible LED display of claim 1, the driving circuit further comprising a driver IC.

11. The flexible LED display of claim 10, wherein the (i) column of the first flexible wire is depicted on the left side of each LED package, the (i+2) column of the first flexible wire is depicted on the right side of each LED package, and the (i+1) column of the first flexible wire is depicted under each LED package.

12. The flexible LED display of claim 10, wherein the (i) column of the first flexible wire is depicted on the left side of each LED package, and the (i+2), the (i+1) columns of the first flexible wire are depicted on the right side of each LED package.

13. The flexible LED display of claim 12, further comprising a dielectric layer sandwiched between the intersection of third extension part of the (i+2) column of the first flexible wire and the (i+1) column of the first flexible wire.

14. The flexible LED display of claim 13, the dielectric layer is consisted of a single-layered or multiple-layered insulating material.

15. A flexible LED display, comprising:
a transparent flexible substrate having a top surface and a bottom surface opposite to each other;
3P columns of first flexible wirings and Q rows of second flexible wirings formed on the top surface of the flexible substrate, whereby the first flexible wirings and the second flexible wirings cross over with each other to define P*Q pixels, and each pixel comprising:
a first sub-pixel, addressed by the (r) column of the first flexible wirings and the (s) row of the second flexible wiring;
a second sub-pixel, addressed by the (r+1) column of the first flexible wirings and the (s) row of the second flexible wiring;
a third sub-pixel, addressed by the (r+2) column of the first flexible wirings and the (s) row of the second flexible wiring;
wherein P, Q, r, s are natural numbers, and $1 \leq r \leq 3P-2$, $1 \leq s \leq Q$;
an insulating layer sandwiched between the intersections of each first flexible wiring and each second flexible wiring or overlaid each second flexible wiring;
a plurality of first LED packages mounted within each of the first sub-pixels;
a plurality of second LED packages mounted within each of the second sub-pixels;
a plurality of third LED packages mounted within each of the third sub-pixels;
a first fan-shaped circuit connected to the first flexible wirings;
a second fan-shaped circuit connected to the second flexible wirings; and
a driving circuit respectively interconnecting the first fan-shaped circuit and the second fan-shaped circuit.

16. The flexible LED display of claim 15, wherein the transparent flexible substrate is selected from one of the group consisting of Polyethylene terephthalate (PET), Poly (methyl methacrylate (PMMA), Polyimide (PI), Polycarbonate (PC) and glass or combination thereof.

17. The flexible LED display of claim 15, wherein the first flexible wires and the second flexible wires are selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof.

18. The flexible LED display of claim 15, wherein the first LED packages are red LED packages or red LED flip-chips.

19. The flexible LED display of claim 15, wherein the second LED packages are green LED packages or green LED flip-chips.

20. The flexible LED display of claim 15, wherein the third LED packages are blue LED packages or blue LED flip-chips.

21. The flexible LED display of claim 15, wherein each of the first, second, third LED packages is respectively mounted within each of the first-subpixels, each of the second sub-pixels and each of the third sub-pixels by means of a conductive glue cured at a temperature lower than 250 degree C. and/or an anisotropic conductive film (ACF).

22. The flexible LED display of claim 15, wherein the insulating layer is consisted of a single-layered or multiple-layered insulating material.

23. The flexible LED display of claim 15, whereby:
each of the first LED packages comprises a fifth conductive pin and a sixth conductive pin, and the (s) row of the second flexible wire has a fifth extension part connected to a fifth conductive pad, and the (r) column of the first flexible wire has a sixth extension part connected to a sixth conductive pad, wherein the fifth conductive pin is electrically connected to the (s) row of the second flexible wire by interconnecting the fifth conductive pad, and the sixth conductive pin is electrically connected to the (r) column of the first flexible wire by interconnecting the sixth conductive pad;
each of the second LED packages comprises a seventh conductive pin and a eighth conductive pin, and the (s) row of the second flexible wire has a seventh extension part connected to a seventh conductive pad, and the (r+1) column of the first flexible wire has an eighth extension part connected to an eighth conductive pad, wherein the seventh conductive pin is electrically connected to the (s) row of the second flexible wire by interconnecting the seventh conductive pad, and the eighth conductive pin is electrically connected to the (r+1) column of the first flexible wire by interconnecting the eighth conductive pad; and
each of the third LED packages comprises a ninth conductive pin and a tenth conductive pin, and the (s) row of the second flexible wire has a ninth extension part connected to a ninth conductive pad, and the (r+2) column of the first flexible wire has a tenth extension part connected to a tenth conductive pad, wherein the ninth conductive pin is electrically connected to the (s) row of the second flexible wire by interconnecting the ninth conductive pad, and the tenth conductive pin is electrically connected to the (r+2) column of the first flexible wire by interconnecting the tenth conductive pad.

24. The flexible LED display of claim 23, the driving circuit further comprising a driver IC.

25. The flexible LED display of claim 15, wherein the insulating layer is consisted of a single-layered or multiple-layered insulating material.

26. A flexible LED display, comprising:
a transparent flexible substrate having a top surface and a bottom surface opposite to each other;
2A columns of first flexible wirings and 2B rows of second flexible wirings formed on the top surface of the flexible substrate, whereby the first flexible wirings and the second flexible wirings cross over with each other to define A*B pixels, and each pixel comprising:
a first sub-pixel, addressed by the (d) column of the first flexible wirings and the (e) row of the second flexible wiring;
a second sub-pixel, addressed by the (d+1) column of the first flexible wirings and the (e) row of the second flexible wiring;
a third sub-pixel, addressed by the (d) column of the first flexible wirings and the (e+1) row of the second flexible wiring;
a fourth sub-pixel, addressed by the (d+1) column of the first flexible wirings and the (e+1) row of the second flexible wiring;
wherein A, B, d, e are natural numbers, and $1 \leq d \leq 2A-1$, $1 \leq e \leq 2B-1$;
an insulating layer sandwiched between the intersections of each first flexible wiring and each second flexible wiring or overlaid each second flexible wiring;
a plurality of first LED packages mounted within each of the first sub-pixels;
a plurality of second LED packages mounted within each of the second sub-pixels;
a plurality of third LED packages mounted within each of the third sub-pixels;
a plurality of fourth LED packages mounted within each of the fourth sub-pixels;
a first fan-shaped circuit connected to the first flexible wirings;
a second fan-shaped circuit connected to the second flexible wirings; and
a driving circuit respectively interconnecting the first fan-shaped circuit and the second fan-shaped circuit.

27. The flexible LED display of claim 26, wherein the transparent flexible substrate is selected from one of the group consisting of Polyethylene terephthalate (PET), Poly (methyl methacrylate (PMMA), Polyimide (PI), Polycarbonate (PC) and glass or combination thereof.

28. The flexible LED display of claim 26, wherein the first flexible wires and the second flexible wires are selected from one of the group consisting of gold wire, silver wire, silver slurry, copper wire, carbon nanotube, poly-(3,4-ethylenedioxy thiophene)-polystyrene sulfonic acid (PEDOT) and nano silver or combination thereof.

29. The flexible LED display of claim 26, wherein the first LED packages are red LED packages or red LED flip-chips.

30. The flexible LED display of claim 26, wherein the second LED packages are green LED packages or green LED flip-chips.

31. The flexible LED display of claim 26, wherein the third LED packages are blue LED packages or blue LED flip-chips.

32. The flexible LED display of claim 26, wherein the fourth LED packages are yellow LED packages or yellow LED flip-chips.

33. The flexible LED display of claim 26, wherein the fourth LED packages are white LED packages or white LED flip-chips.

34. The flexible LED display of claim 26, wherein each of the first, second, third LED and fourth packages is respectively mounted within each of the first-subpixels, each of the second sub-pixels, each of the third sub-pixels and each of the fourth sub-pixels by means of a conductive glue cured at a temperature lower than 250 degree C. and/or an anisotropic conductive film (ACF).

35. The flexible LED display of claim 26, whereby:
each of the first LED packages comprises a fifth conductive pin and a sixth conductive pin, and the (e) row of the second flexible wire has a fifth extension part connected to a fifth conductive pad, and the (d) column of the first flexible wire has a sixth extension part connected to a sixth conductive pad, wherein the fifth conductive pin is electrically connected to the (e) row of the second flexible wire by interconnecting the fifth conductive pad, and the sixth conductive pin is electrically connected to the (d) column of the first flexible wire by interconnecting the sixth conductive pad;

each of the second LED packages comprises a seventh conductive pin and a eighth conductive pin, and the (e) row of the second flexible wire has a seventh extension part connected to a seventh conductive pad, and the (d+1) column of the first flexible wire has an eighth extension part connected to an eighth conductive pad, wherein the seventh conductive pin is electrically connected to the (e) row of the second flexible wire by interconnecting the seventh conductive pad, and the eighth conductive pin is electrically connected to the (d+1) column of the first flexible wire by interconnecting the eighth conductive pad;

each of the third LED packages comprises a ninth conductive pin and a tenth conductive pin, and the (e+1) row of the second flexible wire has a ninth extension part connected to a ninth conductive pad, and the (d) column of the first flexible wire has a tenth extension part connected to a tenth conductive pad, wherein the ninth conductive pin is electrically connected to the (e+1) row of the second flexible wire by interconnecting the ninth conductive pad, and the tenth conductive pin is electrically connected to the (d) column of the first flexible wire by interconnecting the tenth conductive pad; and each of the fourth LED packages comprises a eleventh conductive pin and a twelfth conductive pin, and the (e+1) row of the second flexible wire has a eleventh extension part connected to a eleventh conductive pad, and the (d+1) column of the first flexible wire has a twelfth extension part connected to a twelfth conductive pad, wherein the eleventh conductive pin is electrically connected to the (e+1) row of the second flexible wire by interconnecting the eleventh conductive pad, and the twelfth conductive pin is electrically connected to the (d+1) column of the first flexible wire by interconnecting the twelfth conductive pad.

36. The flexible LED display of claim 35, the driving circuit further comprising a driver IC.

* * * * *